United States Patent [19]
Yasutake

[11] Patent Number: 5,440,122
[45] Date of Patent: Aug. 8, 1995

[54] SURFACE ANALYZING AND PROCESSING APPARATUS

[75] Inventor: Masatoshi Yasutake, Tokyo, Japan

[73] Assignee: Seiko Instruments Inc., Tokyo, Japan

[21] Appl. No.: 186,137

[22] Filed: Jan. 24, 1994

[30] Foreign Application Priority Data

Jan. 22, 1993 [JP] Japan .................... 5-009585

[51] Int. Cl.6 .............. H01J 37/00; H01J 37/30
[52] U.S. Cl. .................. 250/443.1; 250/306; 250/492.2
[58] Field of Search .......... 250/306, 423 F, 443.1, 250/492.2

[56] References Cited

U.S. PATENT DOCUMENTS

| | | | |
|---|---|---|---|
| 4,550,257 | 10/1985 | Binnig et al. | 250/423 F |
| 4,618,767 | 10/1986 | Smith et al. | 250/306 |
| 4,747,698 | 5/1988 | Wickramasinghe | 250/306 |
| 4,823,004 | 4/1989 | Kaiser et al. | 250/306 |
| 5,047,637 | 9/1991 | Toda | 250/443.11 |
| 5,047,649 | 9/1991 | Hodgson et al. | 250/492.3 |
| 5,099,117 | 3/1992 | Frohn et al. | 250/306 |
| 5,278,406 | 1/1994 | Kinoshita et al. | 250/306 |

*Primary Examiner*—Bruce C. Anderson
*Attorney, Agent, or Firm*—Spensley Horn Jubas & Lubitz

[57] ABSTRACT

A surface analyzing and processing apparatus analyzes the surface of a sample by detecting secondary electrons, secondary ions, and the like coming out from the surface of the sample while exciting the surface of the sample by means of a probe of an atomic force microscope (AFM) and minutely etches the surface of the sample or deposits a thin film thereon after observing the sample with a high resolving power in the nanometer range by means of the AFM.

11 Claims, 2 Drawing Sheets

FIG. 2
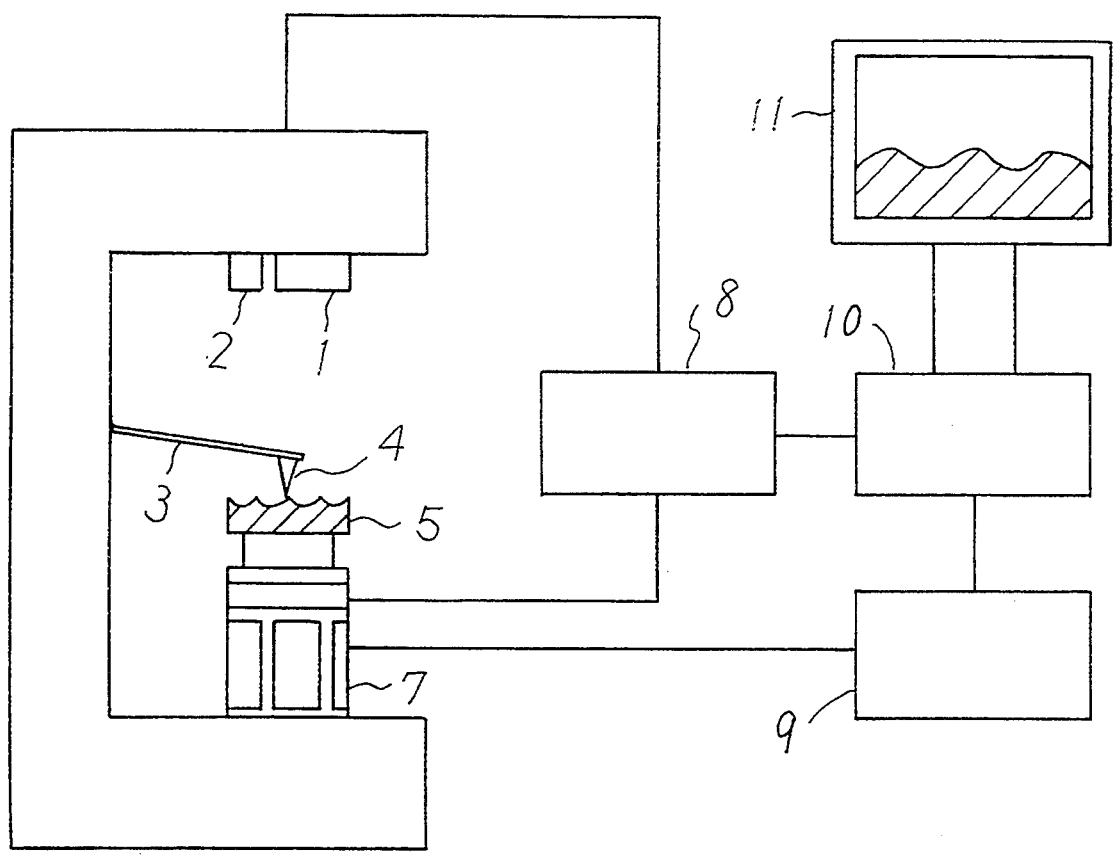
FIG. 3(a)
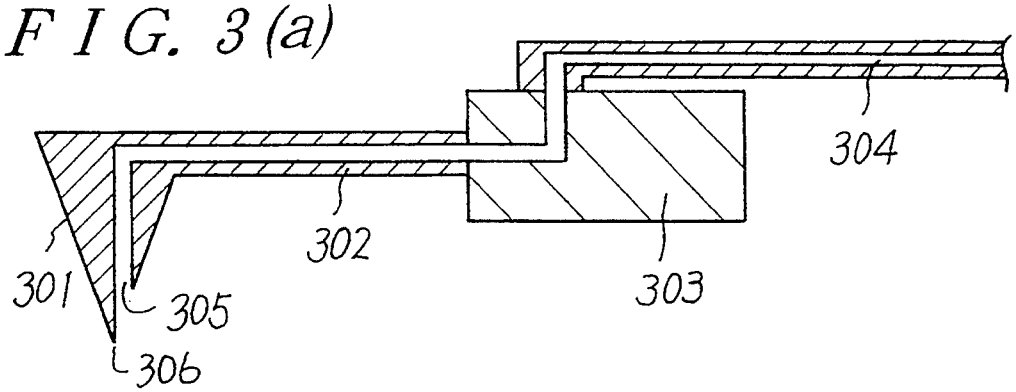
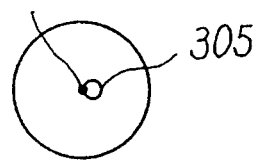
FIG. 3(b)

SURFACE ANALYZING AND PROCESSING APPARATUS

BACKGROUND OF THE INVENTION

The invention relates to a surface analyzing apparatus for analyzing the surface of a sample by detecting secondary electrons, secondary ions, and the like emitted from the surface of the sample upon excitation of the surface of the sample by means of a probe of an atomic force microscope (AFM) after observing the sample with a high resolving power of nanometer order by means of the AFM, and to a surface processing apparatus for minutely etching the surface of a sample or for depositing a thin film on it.

Existing surface analyzing apparatus include the following:
1: X-ray photoelectron spectroscopes,
2: Auger electron spectroscopes, and
3: Secondary ion mass spectroscopes, and the like.

None of apparatus 1 to 3 can have a high resolving power (down to the order of 10 nm), and if their probe were miniaturized to obtain a high resolving power, the result is a deterioration of their analysis sensitivity. And none of apparatus 1 to 3 can give information of roughness in the direction perpendicular to the surface of a sample.

As an existing processing apparatus, an apparatus performing a sputtering process by means of a Ga ion beam, an apparatus which decomposes and deposits organometallic gas by means of an ion beam, and the like are known. The size of the area they can process is limited by their probe diameter to about 100 nm.

The atomic force microscope (AFM) was described by G. Binnig, CF. Quate, Ch. Gerber, and others in 1986 (Phys. Rev. Lett. 56, 930 (1986)).

As compared with other observation apparatus, the AFM has as one advantage that it can observe a three-dimensional shape of even a sample of insulating material with high resolution as an observation apparatus of a surface shape.

In existing systems, it has been difficult to perform a three-dimensional observation, a component analysis of the surface of a sample, and an etching process of the surface and/or a deposition process on the surface, and the like with high resolution (of 10 nm or less) by means of a single apparatus.

SUMMARY OF THE INVENTION

An object of the invention is to provide a system which has a capability of performing observation, analysis, and processing of the surface of a sample with high resolution by means of a single apparatus, in consideration of problems presented by prior art apparatus.

Utilizing the excellent three-dimensional resolution of the AFM, the present invention gives an excitation to the surface of a sample by means of a probe of the AFM, makes a surface analysis by analyzing particles scattered from the surface of the sample, and processes the surface of the sample by exciting the surface with the probe of the AFM while introducing a gas very close to the sample surface.

A system of the invention has a conductive probe of an atomic force microscope (AFM) disposed very close to the sample surface and has a mass spectrometer (MS) having an ion introducing system for secondary ion analysis and a secondary electron detector having an electrostatic analyzer for secondary electron analysis which are disposed near the sample. The system uses a conductive probe as the probe of the AFM, and uses a bias voltage supply which can apply a continuous or pulsed voltage between the probe and a sample holding stage. The system is provided with systems for introducing a plurality of gasses with a pressure control function which can introduce organic gas and sulfur dioxide gas.

The sample stage is provided with a heater and a thermometer for temperature control of the sample substrate. Furthermore, the system is provided with a current measuring device, such as an ammeter, for detecting a current flowing into the sample stage when applying a continuous or pulsed voltage and an integrator for integrating a current measuring signal.

With the above-mentioned arrangement, the system takes in data of roughness of the surface of a sample for each pixel while scanning with the probe of the AFM and monitoring the roughness of the surface of the sample. Next, for controlling a distance between the probe and the sample by means of a Z-axis piezoelectric transducer (PZT) device, the system applies a voltage between the probe and the sample from the bias voltage supply source to give an excitation to the surface of the sample. The system analyzes the secondary ions scattering from the surface of the sample by means of the mass spectrometer having an ion introducing system, or detects the secondary electrons scattering from the surface of the sample and performs an energy analysis of them by means of the electrostatic analyzer. The system can perform an analysis of the surface of the sample by carrying out the above-mentioned operation for each pixel and scanning a specified area on the x-y plane by displacing the probe or the sample.

Next, the system can perform an etching process or a deposition process of the surface of the sample by introducing a gas through a reactive gas introducing nozzle or an organometallic gas introducing nozzle, properly controlling temperature of the sample substrate, and imposing an excitation on the surface by means of the probe of the AFM.

BRIEF DESCRIPTION OF THE DRAWING

FIG. 2 is a simplified side elevational view showing the structure of an AFM of optical lever type used in the embodiment of FIG. 1.

FIG. 3(a) is a cross-sectional view of the probe part of FIG. 2 provided with a hole for introducing gas.

FIG. 3(b) is a plan view of the gas introducing hole part of FIG. 3(a) viewed from the bottom.

DESCRIPTION OF THE PREFERRED EMBODIMENTS

Figure 1:
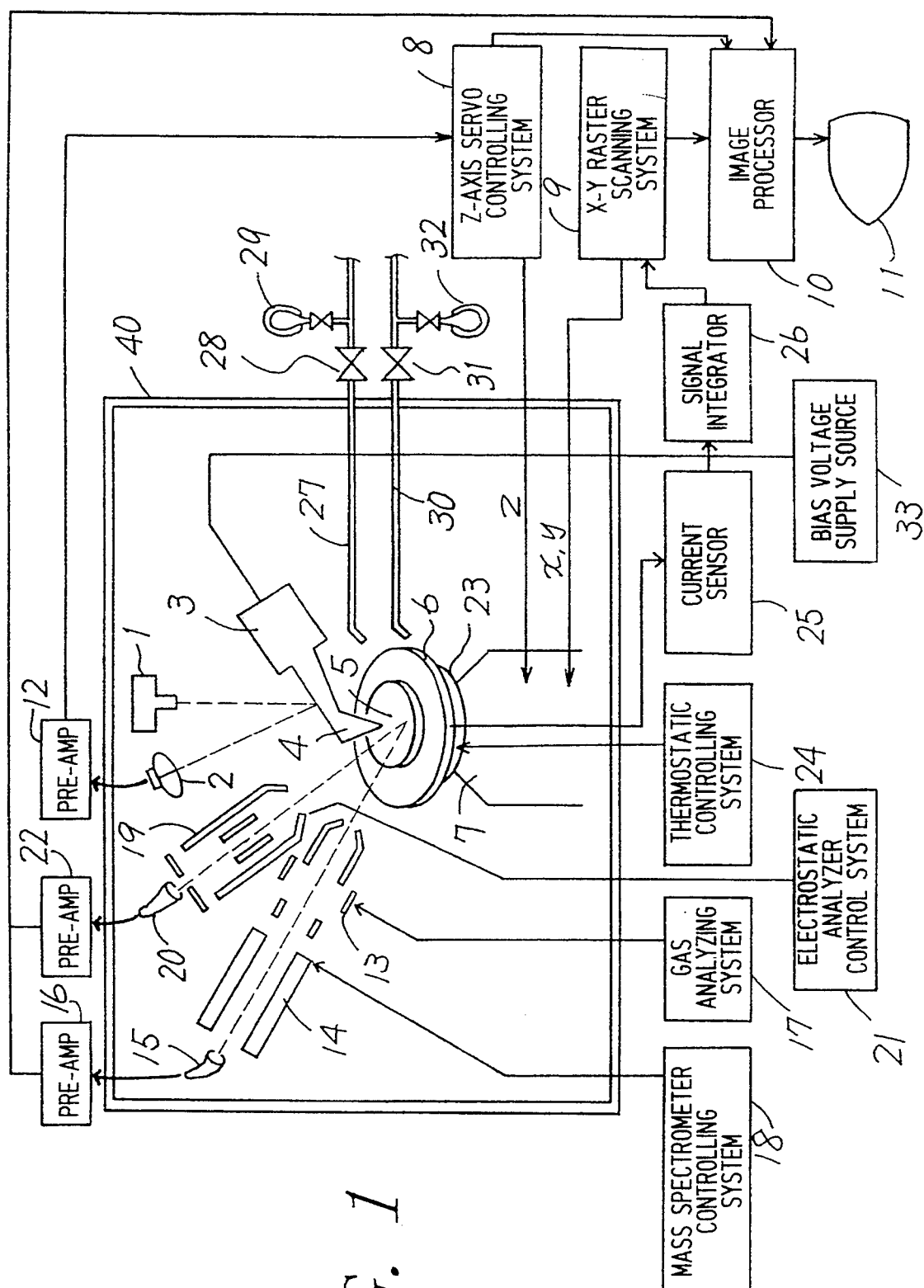
FIG. 1 is partly a pictorial view and partly a block diagram showing the structure of an embodiment of the invention.

FIG. 2 shows one embodiment of an AFM of optical lever type used in the invention. A sample 5 is fixed on a sample stage and is kept at ground potential. A conductive probe 4 supported by a cantilever 3 of the AFM scans the surface of sample 5. Bending of cantilever 3 is detected by an optical lever system composed of a semiconductor laser 1 and a position sensitive detector (2-divided or 4-divided photodiode) 2. The signal detected by the optical lever system is sent to a Z-axis servo controlling system 8 after being amplified, and the Z-axis servo controlling system 8 controls the z-axis of a three-dimensional scanner 7 so as to keep the bending of cantilever 3 at a specified value. Movement of scanner 7 in the x-y directions is controlled by an x-y raster scanning system 9. By supplying a voltage corresponding to the control voltage from system 8 at this time into an image processor 10 and synchronizing it with the output of x-y raster scanning system 9, a three-dimensional image can be obtained on an image displaying system 11. The order of measurement of a three-dimensional image by means of an AFM and the image produced by means of an AFM are as described above.

Referring to FIG. 1, an embodiment of the invention is described in the following.

First, an example of component analysis on the surface is described which is carried out at the same time as image measurement. In FIG. 1, elements 1-5 and 7-11 are as described above with reference to FIG. 2. Scanner 7 carries a sample stage 6 on which sample 5 is mounted and fixed. A preamplifier 12 is connected between detector 2 and Z-axis servo controlling system 8. The apparatus shown in FIG. 1 further includes a residual gas analyzing system 13 of ion introducing type, a mass spectrometer 14, a secondary ion detector 15, a preamplifier 16, a residual gas analyzing system 17 of ion introducing type, a mass spectrometer controlling system 18, an electrostatic analyzer 19, a secondary electron detector 20, an electrostatic analyzer controlling system 21, a preamplifier 22, a heater 23, a thermostatic controlling system 24, an ammeter or other current sensor 25 for measuring minute current levels, a signal integrator 26, a reactive gas introducing nozzle 27, a reactive gas leaking valve 28, an evaporation chamber 29, an organic gas introducing nozzle 30, an organic gas leaking valve 31, an evaporation chamber 32, a bias voltage supply source 33, and a vacuum chamber 40. Components 1-7, 13-15, 19, 20, 23, 27 and 30 are housed in vacuum chamber 40.

Now, analysis of secondary ions scattering from the surface of the sample 5 is described as an example. After taking in data of an image of surface roughness at a pixel measuring point, the system fixes the Z-axis servo controlling system 8 and keeps the distance between the sample 5 and the probe 4 at a specified value (usually 1 nm to 10 nm) by giving a certain voltage to the z-axis of the three-dimensional scanner 7 (depending on the situation, the probe 4 may be left as it is in contact with the sample 5). In this state, the system evaporates material from the sample 5 by applying a pulsed voltage to it from the bias voltage supply source 33. A part of the material evaporated from sample 5 is ionized by a high intensity electric field between the probe 4 and the sample 5, and the ions are analyzed by mass spectrometry with ion introducing system gas analyzing system 13 and mass spectrometer 14, which may be a quadrupole mass spectrometer or the like. After this, Z-axis servo controlling system 8 is released and the probe is moved to the next pixel and then the same operation is repeated.

By performing such scanning, with evaporation and analysis, all over one image frame gives an image of roughness of the sample 5 and a mass spectrometric image (an image of material of a specific mass number).

As an ionizing process, in addition to the above-mentioned field ionizing process using a strong electric field, there are such various processes as those using heat generation of the sample 5 by an electric current, mechanical contact of the probe 4 and the sample 5, chemical reaction among the probe 4, absorbed molecules and the sample 5, combinations thereof, and the like. And in case of detecting secondary electrons or Auger electrons, the system can place an introducing electrode of electrostatic analyzer 19 at a positive potential relative to sample stage 6, carry out energy analysis of the introduced secondary electrons or Auger electrons by means of the electrostatic analyzer 19, and then detect them by means of the secondary electron detector 20. In this case, if a phase detection is carried out by means of a lock-in amplifier or the like in synchronization with a period of the pulse voltage applied to the probe 4 of the AFM and the surface of the sample, the S/N ratio of the detection is improved. If one picture is composed by making such analysis as this for each pixel, an image of roughness of the sample 5 and a specific electron image analyzed by energy analysis can be obtained.

Next, an example of fine processing of the surface of the sample 5, which may be a type of substrate, will be described. First, a process of etching the surface of the sample 5 is described. The etching process is based on a principle that the surface of the sample 5 is etched by introducing a reactive gas onto or very close to the surface of the substrate to be etched, allowing the reactive gas to react with molecules of the surface of the substrate under the influence of an electric current from the AFM probe 4, and removing the reacted part from the surface of the substrate. In order to etch a specified line width, specified conditions must be established for the following parameters:

1. The quantity of the reactive gas introduced into vacuum chamber 40,
2. The temperature of sample 5, and
3. The electric current and voltage, and the distance between sample 5 and probe 4, and the like.

A method of controlling these parameters is described in the following.

The reactive gas is introduced via gas introducing nozzle 27 into the vacuum chamber 40 under a pressure controlled by the variable leak valve 28 or the like. A reactive material which is not gaseous at room temperature is introduced after being evaporated in the preheating chamber 29. The reactive gas is kept so that its partial pressure in the vacuum chamber may be constant through a residual gas analysis made by the mass spectrometer 14. Next, the temperature of sample 5 is controlled to be kept at a specified value by means of the heater 23 built into sample stage 6 and a thermometer gauge and the thermostatic controlling system 24. And then in order to keep constant the current between sample 5 and probe 4, the system detects the magnitude of the current flowing through sample stage 6 from the conductive sample 5 for each pixel by means of the ammeter for minute current 25, integrates a signal representing the magnitude of the current by means of the integrator 26 for a specified time, sets the bias voltage between probe 4 and sample 5 at zero volt when the integrated value of the current reaches a specified value, and then controls the raster scanning system 10 so that the point to be processed may move to the next pixel.

Accordingly, the system controls the pulse width of bias voltage pulses applied between the probe 4 and sample 5 so that a specified quantity of electric charge may be injected for each pixel to be etched, In this case, the upper limit of the bias voltage is set at a specified value.

In a case where sample 5 is made of insulating material, since current from sample 5 cannot be obtained, the system controls a point to be processed so as to move to the next pixel after a specified time elapses for each pixel to be etched. In this case, the distance between probe 4 and sample 5 is controlled so as to be kept constant. In order to control this distance, the system sets the bias voltage at zero volt, brings sample 5 into contact with probe 4, and takes in information of roughness of sample 5 as data. And then the system keeps the distance between sample 5 and probe 4 at a specified value by fixing the Z-axis servo system 8 and applying a specified voltage to the z-axis of the three-dimensional scanner 7 (depending on the conditions, probe 4 may be left as it is in contact with the surface of sample 5). The system applies a specified voltage to probe 4 from the bias voltage supply source 33 in this state, and when the integrated value of the current from probe 4 reaches a specified value or after a specified period elapses, the system resets the bias voltage at zero volt, releases the Z-axis servo system 8, and then moves to the next pixel by means of the x-y raster scanning system 9.

In the above-mentioned operation, since an etching process is performed after measuring the roughness of the surface, the operation takes a long time. In order to perform only the etching process at a high speed, the surface to be etched is measured in advance by means of an AFM and data of each pixel related to roughness of the surface are stored in a memory of the image processor 10, and then after probe 4 or sample 5 is moved so that probe 4 may come to be directly above the pixel to be etched, the system applies a certain voltage to the z-axis of the three-dimensional scanner 7 so that probe 4 may come to be at a specified distance from the surface of sample 5. After this, the system applies a bias voltage to probe 4 in the same manner as described above, and moves to the next pixel after finishing the etching process.

By monitoring the reactive ions or reactive gas generated in the etching process by means of the above-mentioned mass spectrometer, it is also possible to confirm the state of the etching process and its end point. And after finishing the etching process, the roughness of the surface of sample 5 may be confirmed for each pixel and the actual depth of each etched hole may be measured.

As mentioned above, an etching process can be performed under specified conditions by controlling the quantity of reactive gas to be introduced, the temperature of sample 5, and the electric current, voltage, and distance between sample 5 and the probe 4.

Next, an example of process of deposition onto the surface of sample 5 will be described. The deposition process is based on a principle that decomposed products made by decomposition of certain gasses are deposited on the surface of sample 5 under the influence of the electric current from probe 4 of the AFM after introducing an organic gas or an organometallic gas onto or very close to the surface of sample 5 of substrate type via the organic gas introducing nozzle 30 and the leak valve 31. In order to cause deposited material to have a specified line width, the reaction conditions:

1. The quantity of the reactive gas introduced into vacuum chamber 40,
2. The temperature of sample 5, and
3. The electric current and voltage, and the distance between sample 5 and probe 4, and the like, need to be controlled.

Since the value of each parameter to be controlled is different from the case of etching but the controlling method can be similar to the case of etching, a description of the control procedures will not be repeated.

As mentioned above, a displacement detecting method of an AFM has been described on the basis of a system using an optical lever, but other embodiments of the invention can use other devices such as an optical interferometer, a capacitance meter, or the like. And in case of measuring secondary ions which have been scattered from a sample with high resolution, a mass spectrometer of the sector type may be used.

The gas introducing nozzle is disposed very close to conductive probe 4 of the AFM so as not to raise the base pressure inside the vacuum chamber. Depending on the conditions, the reactive gas may be introduced through a minute hole made near the tip of the probe.

FIG. 3(a) is a cross-sectional view of an embodiment of the probe part provided with a hole for introducing gas. FIG. 3(b) is a plan view of the gas introducing hole viewed from the bottom. In the figures, reference number 301 is a probe, 302 is a lever portion, 303 is a lever base portion, 304 is a gas introducing pipe, 305 is a gas introducing hole, and 306 is the tip of the probe. The embodiment of FIGS. 3(a) and 3(b) may, of course, be employed in the apparatus of FIGS. 1 and 2.

As an example of temperature control of the sample stage, the disclosed examples involve temperatures higher than or equal to room temperature, but there can also be cases in which the system controls the temperature of the sample stage so as to cool it to a temperature lower than or equal to room temperature in order to increase the quantity of absorbed gas. And in order to make it easy to replace sample 5 and probe 4, the vacuum chamber may be divided into two chambers and have a load lock mechanism.

By using a conductive cantilever in an AFM and using this lever as a probe, it has become possible to observe also a vertical image (roughness) of the surface which cannot be observed by an existing apparatus as well as a horizontal (flat) image of the surface with a spatial resolution one order of magnitude (i.e. a factor of 10) or greater than existing surface analyzing apparatus at the same time and to analyze component elements or component compounds of the surface of a sample while keeping such a resolution. And introducing the appropriate gas into the vacuum chamber makes it possible to perform an etching process and/or a deposition process at a specific area on a sample substrate. As mentioned above, the invention has made it possible to carry out observation, analysis, and processing with accuracy in the nanometer range by means of a single apparatus.

This application relates to subject matter disclosed in Japanese Application number 5-9585, filed on Jan. 22, 1993, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. Apparatus for analyzing and processing a surface of a sample, comprising:

a vacuum chamber;

an elastic lever having a tip and a conductive probe mounted on said tip, said lever and said probe being mounted inside said vacuum chamber at a location such that said tip is above the surface of a sample installed in said vacuum chamber;

displacement detecting means connected to said lever for detecting displacement of said lever;

a servo system and piezoelectric actuator connected for controlling at least one of: the displacement of said lever so as to keep said lever at a constant position; and the distance between the surface of a sample and the probe so as to keep the distance at a specified value;

a thermostatic controlling system disposed for controlling the temperature of the surface of the sample to maintain the temperature at a specified value;

a bias voltage supply source connected for selectively applying one of a pulsed voltage and a continuous voltage between said probe and the sample;

current measuring means connected for detecting minute levels of current flowing out from the surface of the sample when a voltage is applied between said probe and the sample by said bias voltage supply source, said current measuring means supplying a signal representative of the detected current;

signal integrating means coupled to said current measuring means for producing an integration signal representative of the time integral of the detected current;

analyzing means disposed for analyzing particles scattered from the surface of the sample when a voltage is applied by said bias voltage supply source; and a plurality of nozzles extending into said vacuum chamber for introducing a selected one of a plurality of gasses into said vacuum chamber under a controlled pressure.

2. Apparatus as defined in claim 1 further comprising an x-y scanner coupled for displacing one of said probe and the sample in directions parallel to the sample surface and a circuit system coupled to said scanner for issuing instructions to effect an incremental relative displacement between said probe and the sample move when the integration signal reaches a specified value for processing the surface of the sample.

3. Apparatus as defined in claim 2, wherein said apparatus is operative for obtaining information of component elements or component compounds of a sample and information of roughness of the surface of the sample at the same time by analyzing particles scattered from the surface of the sample when a specified voltage is applied between the sample and said probe, after fixing a distance between the sample and said probe and after controlling said piezoelectric actuator to keep displacement of the lever constant for each incremental region of the sample surface, and obtaining information of roughness of the surface of the sample.

4. Apparatus as defined in claim 3, wherein said apparatus is operative for observing and processing the surface of a sample at the same time by fixing a distance between the sample and said probe at a specified value, applying a specified voltage between the sample and said probe, and causing the integration signal to reach a specified value, after introducing in advance a reactive gas into said vacuum chamber via one of said nozzles, and obtaining information of roughness of the surface of the sample.

5. Apparatus as defined in claim 2, wherein said apparatus is operative for observing and processing the surface of a sample at the same time by fixing a distance between the sample and said probe at a specified value, applying a specified voltage between the sample and said probe, and causing the integration signal to reach a specified value, after introducing in advance a reactive gas into said vacuum chamber via one of said nozzles, and obtaining information of roughness of the surface of the sample.

6. Apparatus as defined in claim 1, wherein said apparatus is operative for observing and processing the surface of a sample at the same time by fixing a distance between the sample and said probe at a specified value, applying a specified voltage between the sample and said probe, and causing the integration signal to reach a specified value, after introducing in advance a reactive gas into said vacuum chamber via one of said nozzles, and obtaining information of roughness of the surface of the sample.

7. Apparatus as defined in claim 1, wherein said apparatus is operative for obtaining information of component elements or component compounds of a sample and information of roughness of the surface of the sample at the same time by analyzing particles scattered from the surface of the sample when a specified voltage is applied between the sample and said probe, after fixing a distance between the sample and said probe and after controlling said piezoelectric actuator to keep displacement of the lever constant for each incremental region of the sample surface, and obtaining information of roughness of the surface of the sample.

8. Apparatus as defined in claim 7, wherein said apparatus is operative for observing and processing the surface of a sample at the same time by fixing a distance between the sample and said probe at a specified value, applying a specified voltage between the sample and said probe, and causing the integration signal to reach a specified value, after introducing in advance a reactive gas into said vacuum chamber via one of said nozzles, and obtaining information of roughness of the surface of the sample.

9. Apparatus as defined in claim 1 wherein said analyzing means comprise a mass spectrometer.

10. Apparatus as defined in claim 1 wherein said analyzing means comprise an electron detector with an electrostatic analyzer.

11. Apparatus as defined in claim 1 wherein said current measuring means comprise an ammeter.

* * * * *